United States Patent
Ohta et al.

(10) Patent No.: US 8,629,526 B2
(45) Date of Patent: Jan. 14, 2014

(54) SEMICONDUCTOR DEVICE

(75) Inventors: Tsuyoshi Ohta, Kanagawa-ken (JP); Masatoshi Arai, Tokyo (JP); Miwako Suzuki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 13/233,941

(22) Filed: Sep. 15, 2011

(65) Prior Publication Data
US 2012/0241896 A1  Sep. 27, 2012

(30) Foreign Application Priority Data

Mar. 24, 2011 (JP) ................. 2011-066312

(51) Int. Cl.
*H01L 29/47* (2006.01)
(52) U.S. Cl.
USPC .......... 257/471; 257/E29.148; 257/458; 257/656
(58) Field of Classification Search
USPC .......... 257/458, 471, 656, E33.046, E29.336, 257/E31.036, E31.087–E31.088, 257/E31.061–E31.062, E31.065–E31.066, 257/E29.338, E27.04, E27.068, E29.041
See application file for complete search history.

(56) References Cited

U.S. PATENT DOCUMENTS

| | | | |
|---|---|---|---|
| 5,017,976 A | 5/1991 | Sugita | |
| 2005/0194610 A1* | 9/2005 | Souma et al. | 257/133 |
| 2006/0231836 A1* | 10/2006 | Kumagai et al. | 257/49 |
| 2006/0244006 A1* | 11/2006 | Fujihira et al. | 257/127 |
| 2006/0244091 A1* | 11/2006 | Kikuchi et al. | 257/471 |
| 2007/0072359 A1* | 3/2007 | Takei et al. | 438/234 |
| 2009/0146241 A1* | 6/2009 | Yoshii | 257/476 |
| 2010/0289110 A1* | 11/2010 | Tarui et al. | 257/490 |

FOREIGN PATENT DOCUMENTS

| | | |
|---|---|---|
| JP | 02-151067 | 6/1990 |
| JP | 2000-294805 | 10/2000 |
| JP | 2001-257367 | 9/2001 |
| JP | 2010-118440 | 5/2010 |

OTHER PUBLICATIONS

Japanese Office Action date Aug. 5, 2013, filed in Japanese counterpart Application No. 2011-066312, 6 pages (with translation).

* cited by examiner

*Primary Examiner* — Mamadou Diallo
(74) *Attorney, Agent, or Firm* — Patterson & Sheridan, LLP

(57) ABSTRACT

According to one embodiment, a semiconductor device includes a first semiconductor layer of a first conductivity type, a plurality of second semiconductor regions of a second conductivity type, a third semiconductor region of the second conductivity type and a first electrode. The second regions are provided separately on a first major surface side of the first layer. The third region is provided on the first major surface side of the first layer so as to surround the second regions. The first electrode is provided on the first layer and the second regions. The first layer has a first portion and a second portion. The second portion has a lower resistivity than the first portion. The second portion is provided between the second regions and between the first portion and the first major surface and is provided outside the third region and between the first portion and the first major surface.

17 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2011-066312, filed on Mar. 24, 2011; the entire contents of which are incorporated herein by reference.

FIELD

Embodiments described herein relate generally to a semiconductor device.

BACKGROUND

The constitution mixing a Schottky junction and a pn junction (for example, MPS (Merged PIN Schottky Rectifier)) is known as a semiconductor device improving the trade-off of the forward voltage-leak current characteristics. MPS includes a plurality of p-type semiconductor region formed in an n-type semiconductor region and a Schottky barrier metal contacting the n-type semiconductor region and the p-type semiconductor region. If a reverse voltage is applied in MPS, pinch-off of depletion layers spreading from each p-type semiconductor region occurs at a low voltage. Herewith, electric field increase at the Schottky barrier junction portion is suppressed and a leak current is suppressed.

DETAILED DESCRIPTION

Figure 1:
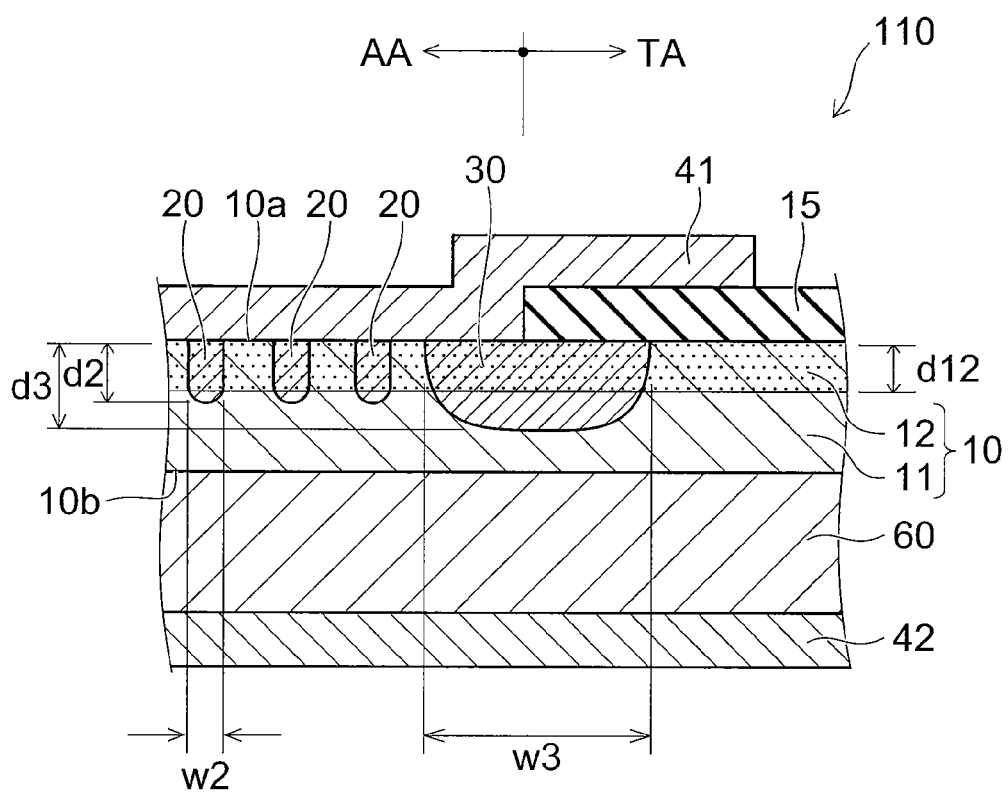
FIG. 1 is a schematic sectional view illustrating the configuration of a semiconductor device according to a first embodiment.

In general, according to one embodiment, a semiconductor device includes a first semiconductor layer of a first conductivity type, a plurality of second semiconductor regions of a second conductivity type, a third semiconductor region of the second conductivity type and a first electrode. The plurality of second semiconductor regions are provided separately on a side of a first major surface of the first semiconductor layer. The third semiconductor region is provided on the side of the first major surface of the first semiconductor layer so as to surround the plurality of second semiconductor regions. The first electrode is provided on the first semiconductor layer and the plurality of second semiconductor regions. The first semiconductor layer has a first portion and a second portion. The second portion has a resistivity lower than a resistivity of the first portion. The second portion is provided between the plurality of second semiconductor regions and between the first portion and the first major surface. The second portion is provided outside the third semiconductor region and between the first portion and the first major surface.

Various embodiments will be described hereinafter with reference to the accompanying drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following description, a specific example such that a first conductivity type is an n-type and a second conductivity type is a p-type is illustrated as one example. Mark "+" attached to notation of conductivity type indicates an impurity concentration relatively higher than notation without "+".

First Embodiment

FIG. 1 is a schematic sectional view illustrating the configuration of a semiconductor device according to a first embodiment.

A semiconductor device 110 according to the first embodiment includes a first semiconductor layer 10 of the first conductivity type (n-type), a plurality of second semiconductor regions 20 of the second conductivity type (p-type), a third semiconductor region 30 of the second conductivity type (p-type) and a first electrode 41.

The first semiconductor layer 10 has a first major surface 10a and a second major surface 10b facing the first major surface 10a. In the embodiment, a direction going perpendicularly from the second major surface 10b toward the first major surface 10a is referred to as a Z-axis direction, one of directions orthogonal to the Z-axis direction is referred to as an X-axis direction, and a direction orthogonal to the Z-axis direction and the Y-axis direction is referred to as a Y-axis direction. The direction from the second major surface 10b to the first major surface 10a may be referred to as upward, and the opposite direction may be referred to as downward.

The plurality of second semiconductor regions 20 are provided on a side of the first major surface 10a of the first semiconductor layer 10 spaced from each other. For example, the second semiconductor regions are provided along the Y-axis direction and disposed along the X-axis direction in a plurality with a predetermined spacing. The second semiconductor regions may be disposed in a plurality with a predetermined spacing along the X-axis direction and the Y-axis direction. The junctions of the second semiconductor regions 20 and the first semiconductor layer 10 results in pn junctions. This pn junction forms a pn junction diode.

The third semiconductor region 30 is provided on the side of the first major surface 10a so as to surround the plurality of second semiconductor regions 20. The third semiconductor region 30 functions as a guard ring.

A device inside the third semiconductor region 30 is referred to as an device region AA and a region outside the third semiconductor region 30 is referred to as a terminal region TA.

The third semiconductor region 30 is formed with a prescribed depth d3 from the first major surface 10a of the third semiconductor region 20 as well as the second semiconductor region 30 along the Z-axis direction. In the semiconductor device 110 illustrated in FIG. 1, the depth d3 from the first major surface 10a of the third semiconductor region 30 along the Z-axis direction is provided deeper than a depth d2 from the first major surface 10a of the second semiconductor region 20 along the Z-axis direction. A width w3 of the third semiconductor region 30 along the X-axis direction is provided wider than a width w2 of the second semiconductor region 20 along the X-axis direction. Thereby, a curvature at lower side corner portion of the third semiconductor region 30 can be large and the breakdown voltage can be improved by relaxation of the electric field concentration.

The first electrode 41 is provided on the first semiconductor layer 10 and the plurality of second semiconductor regions 20. The first electrode 41 makes Schottky junction with the first semiconductor layer 10 and the plurality of second semiconductor regions 20, respectively. That is, the first electrode 41 is a Schottky barrier metal. The Schottky junction between the first electrode 41 and the first semiconductor layer 10 constitutes a Schottky barrier diode.

The first electrode 41 contact also a part of the third semiconductor region 30. On the first major surface 10a, an insulating film 15 is provided from the part of the third semiconductor region toward the terminal region TA side. The first electrode 41 extends from the device region AA side to the terminal region TA side via the insulating film 15. Herewith, when an opposite direction voltage is applied to the first electrode 41, a depletion layer extends from the plurality of semiconductor regions 20 to the terminal region TA side of the third semiconductor region 30, and the breakdown voltage can be improved by suppression of the opposite direction leak current.

In the semiconductor device 110, the first semiconductor layer 10 is formed, for example, on a sixth semiconductor region 60, for example, by epitaxial growth. The sixth semiconductor region 60 having the first conductivity type ($n^+$-type) has a relatively higher impurity concentration than the first semiconductor layer 10. A second electrode 42 is provided on a lower side of the sixth semiconductor region 60. The second electrode 42 is, for example, a cathode electrode and contacts the sixth semiconductor region 60.

In the semiconductor device 110 according to the embodiment, the first semiconductor layer 10 ha a first portion 11 and a second portion 12. The second portion 12 is a region having a lower resistivity than the first portion 11. The second portion 12 is provided between the first portion 11 and the first major surface 10a and between the plurality of second semiconductor regions 20, and outside the third semiconductor region 30.

The second portion 12 is formed the first portion 11, for example, by epitaxial growth on or impurity injection. A depth d12 of the second portion 12 from the first major surface 10a along the Z-axis direction is shallower than the depth d2 of the second semiconductor region 20 from the first major surface 10a along the Z-axis direction.

As an example, the resistivity of the first portion 11 is 0.3 ohm·cm ($\Omega$·cm) and the resistivity of the second portion 12 is 0.1 $\Omega$·cm or more and 0.2 $\Omega$·cm or less. This resistivity is one example, and not limited thereto.

In this manner, if the resistivity of the second portion 12 is lower than the resistivity of the first portion 11, On resistance of the Schottky barrier diode constituted from the first semiconductor layer 10 and the first electrode 41 decreases and the forward voltage can be decreased.

The second portion 12 is formed also on the terminal region TA side of the third semiconductor region 30, ant thus when the opposite direction voltage is applied to the first electrode 41, the inversion layer is hard to be generated at the interface of the first semiconductor layer 10 on the insulating film 15 side. Herewith, in a reverse bias test at high temperature (for example, 100° C.), the inversion layer is formed at the interface of the first semiconductor layer 10 on the insulating film 15 side. Here, because of low resistivity near the interface, the inversion layer is had to be generated and the opposite direction leak current can be suppressed. This can improve the reliability of the semiconductor device 110.

FIG. 2A to FIG. 3C are schematic sectional views illustrating a method for manufacturing the semiconductor device according to the embodiment.

Figure 2A:
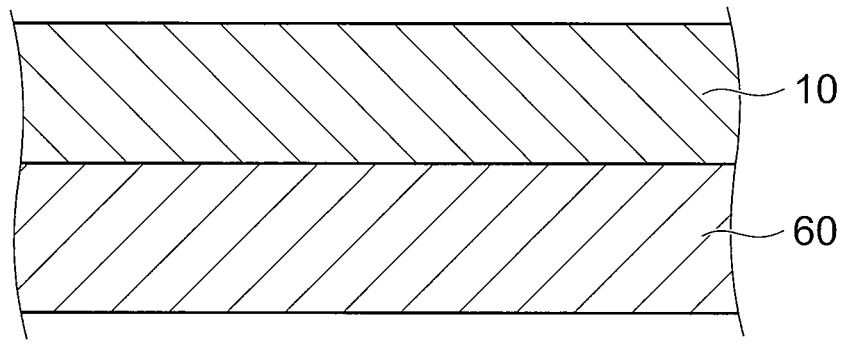
FIG. 2A to FIG. 3C are schematic sectional views illustrating a method for manufacturing the semiconductor device according to the embodiment.

First, as shown in FIG. 2A, the first semiconductor layer 10 is grown epitaxially on the sixth semiconductor region 60 being a support substrate. For example, a silicon substrate with a high concentration is used for the sixth semiconductor region 60. For example, a silicon substrate with a low concentration is used for the first semiconductor layer 10. The impurity concentration in the first semiconductor layer 10 is, for example, $2.2 \times 10^{15}$ cm$^{-3}$, and the resistivity is, for example, 0.3 $\Omega$·cm. The thickness of the first semiconductor layer 10 is, for example, approximately 5 micrometers (5 μm).

Figure 2B:
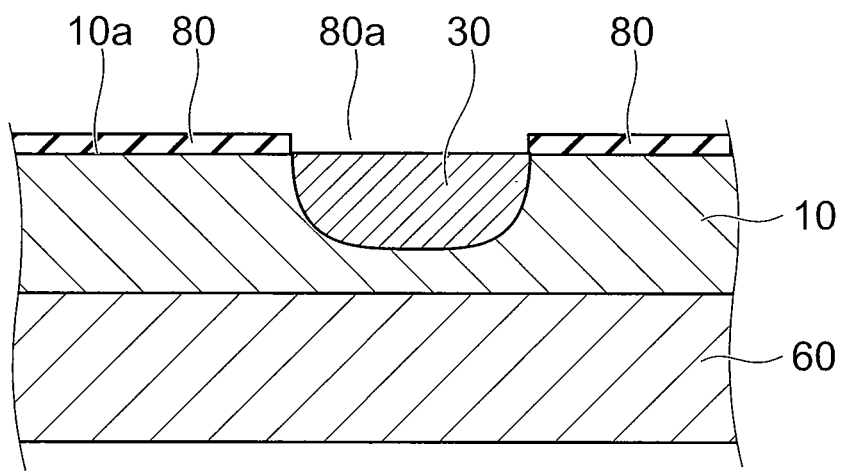

Next, as shown in FIG. 2B, a mask 80 is formed on the first major surface 10a of the first semiconductor layer 10, and an opening 80a is provided. P-type impurity ions such as boron (B) etc. are injected into the opening 80a of the mask 80. After that, the third semiconductor region 30 is formed by thermal diffusion. After the third semiconductor region 30 is formed, the mask 80 is removed.

Figure 2C:
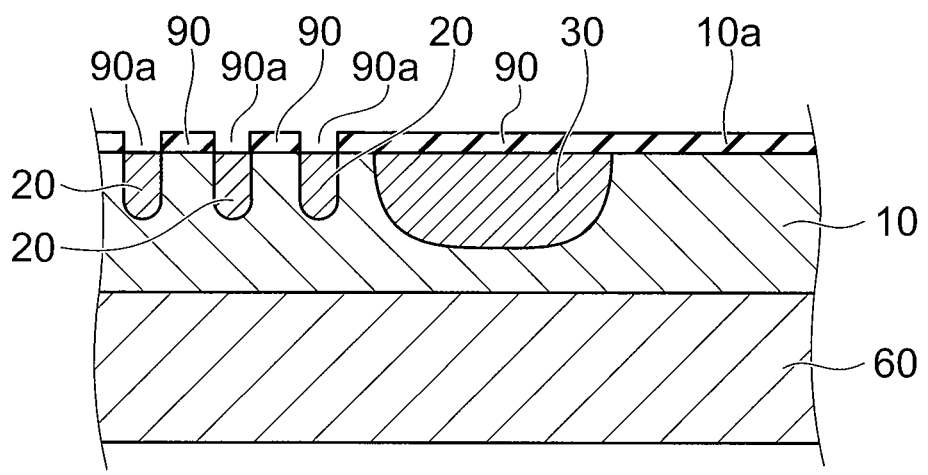

Next, as shown in FIG. 2C, a mask 90 is formed on the first major surface 10a of the first semiconductor layer 10, and openings 90a are provided. P-type impurity ions such as B etc. are injected into the opening 90a of the mask 90. After that, the plurality of second semiconductor regions 20 is formed by thermal diffusion. After the second semiconductor regions 20 are formed, the mask 90 is removed.

Figure 3A:
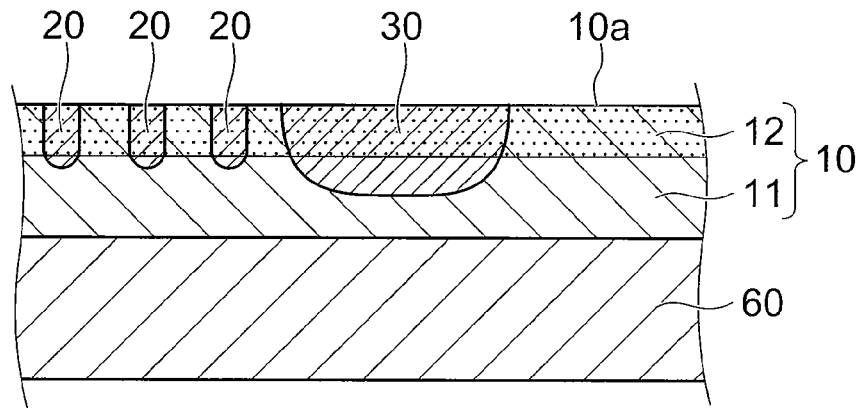

Next, as shown in FIG. 3A, n-type impurity ions such as phosphor (P) etc. are injected onto, for example, entire surface of the first major surface 10a of the first semiconductor layer 10. Herewith, the second portion 12 is formed on the first major surface 10a side of the first semiconductor layer 10. Herewith, the second portion 12 is formed on the first major surface 10a side of the first semiconductor layer 10. A depth of the second portion 12 from the first major surface 10a along the Z-axis direction is, for example, approximately 1 μm. The first semiconductor layer 10 between the second portion 12 and the sixth semiconductor region 60 is the first portion 11. The second portion 12 having n-type impurity ions such as P etc. injected has a lower resistivity than the first portion 11. In the embodiment, the impurity concentration in the second portion 12 is set, for example, to $8 \times 10^{16} \sim 3 \times 10^{16}$ cm$^{-3}$, and thus the resistivity is set to 0.1 $\Omega$·cm or more and 0.2 $\Omega$·cm or less.

In the embodiment, the second portion 12 is formed by injecting ions, for example, onto the entire surface of the first major surface of the first semiconductor layer 10. Therefore, it is unnecessary to form the mask using photolithography etc. in order to form the second portion 12. Here, n-type impurity ions such as P etc. are also injected into the second semiconductor region 20, and thus the depletion layer is easy to stretch to improve the breakdown voltage.

Figure 3B:
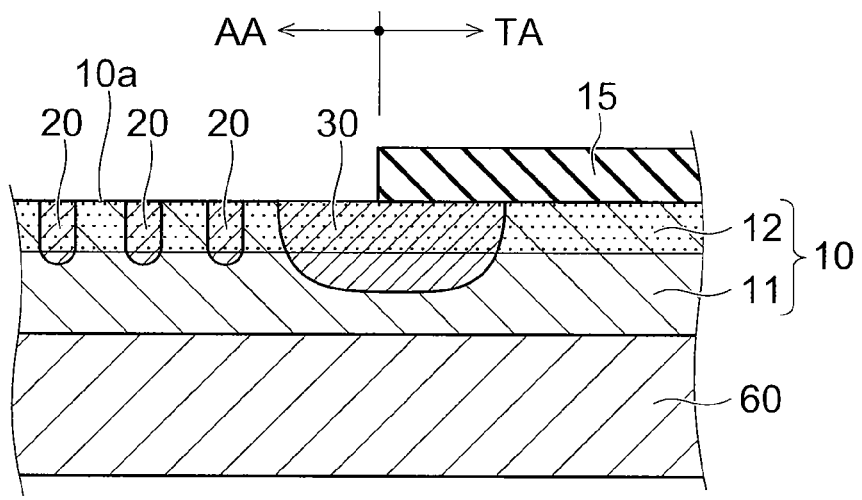

Next, as shown in FIG. 3B, the insulating film 15 is formed on the first major surface 10a from the part of the third semiconductor region 30 to the terminal region TA side.

Figure 3C:
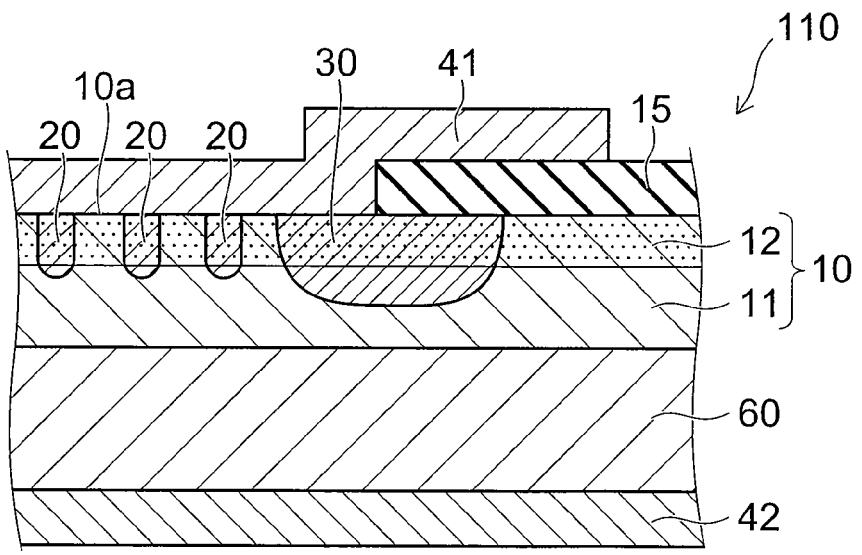

After that, as shown in FIG. 3C, the first electrode 41 and the second electrode 42 are formed. The first electrode 41 contacts the first semiconductor layer 10, the second semiconductor regions 20 and the third semiconductor region 30 on the first major surface 10a side to be formed so as to extend on the insulating film 15. The second electrode 42 is formed on an opposite side of the sixth semiconductor region 60 to the first semiconductor layer 10.

Herewith, the semiconductor device 110 is completed.

Second Embodiment

Figure 4:
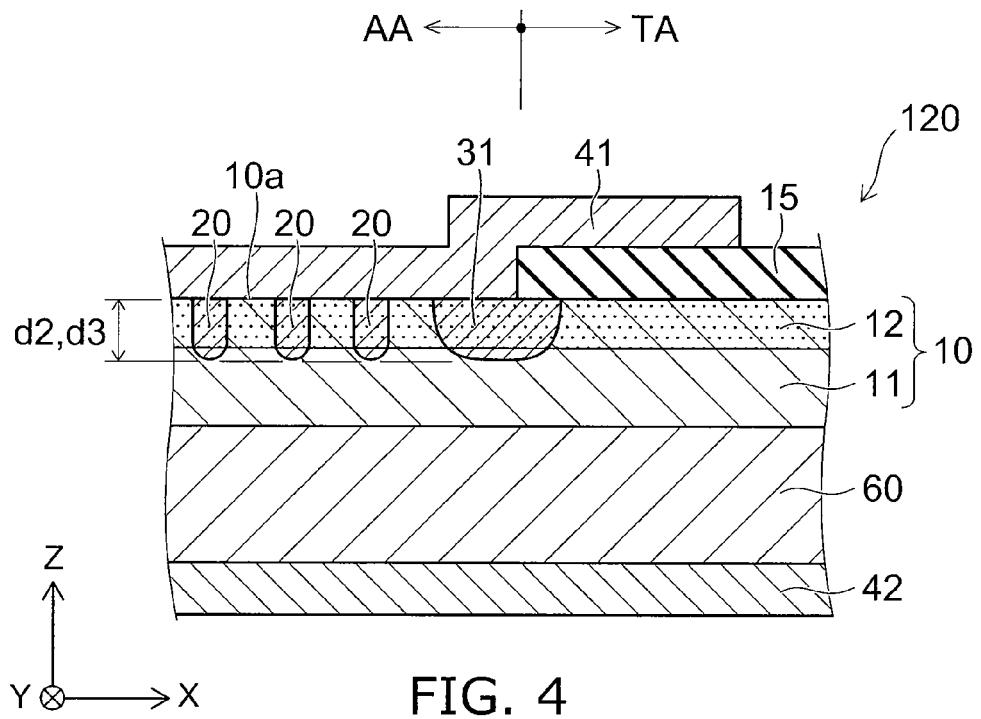
FIG. 4 is a schematic sectional view illustrating the configuration of a semiconductor device according to a second embodiment.

FIG. 4 is a schematic sectional view illustrating the configuration of a semiconductor device according to a second embodiment.

A semiconductor device 120 according to a second embodiment is different from the semiconductor device 110 according to the first embodiment in the depth of the third semiconductor region. Hereinafter, the difference will be described mainly.

As shown in FIG. 4, in the semiconductor device 120 according to the second embodiment, the depth d3 of a third semiconductor region 31 from the first major surface 10a along the Z-axis direction is generally the same as the depth d2 of the second semiconductor regions 20 from the first major surface 10a along the Z-axis direction. That is, the third semiconductor region 31 is formed in the same process as the second semiconductor regions 20.

Specifically, the forming process of the third semiconductor region 30 shown in FIG. 2B is omitted, and in forming the second semiconductor regions 20 shown in FIG. 2C, an opening corresponding to the opening 80a shown in FIG. 2B is formed in the mask 90 with the openings 90a. p-type impurity ions such as B etc. are injected onto the first major surface 10a of the first semiconductor layer 10 via these openings and thermal diffusion is performed. Herewith, the third semiconductor region 31 is formed with the plurality of second semiconductor regions 20. In this manner, the second semiconductor regions 20 and the third semiconductor region 31 are formed in the same process, thereby both are formed with the same depth.

According to the semiconductor device 120 according to the second embodiment, manufacturing processes can be simplified in comparison with the semiconductor device 110 according to the first embodiment.

Third Embodiment

Figure 5:
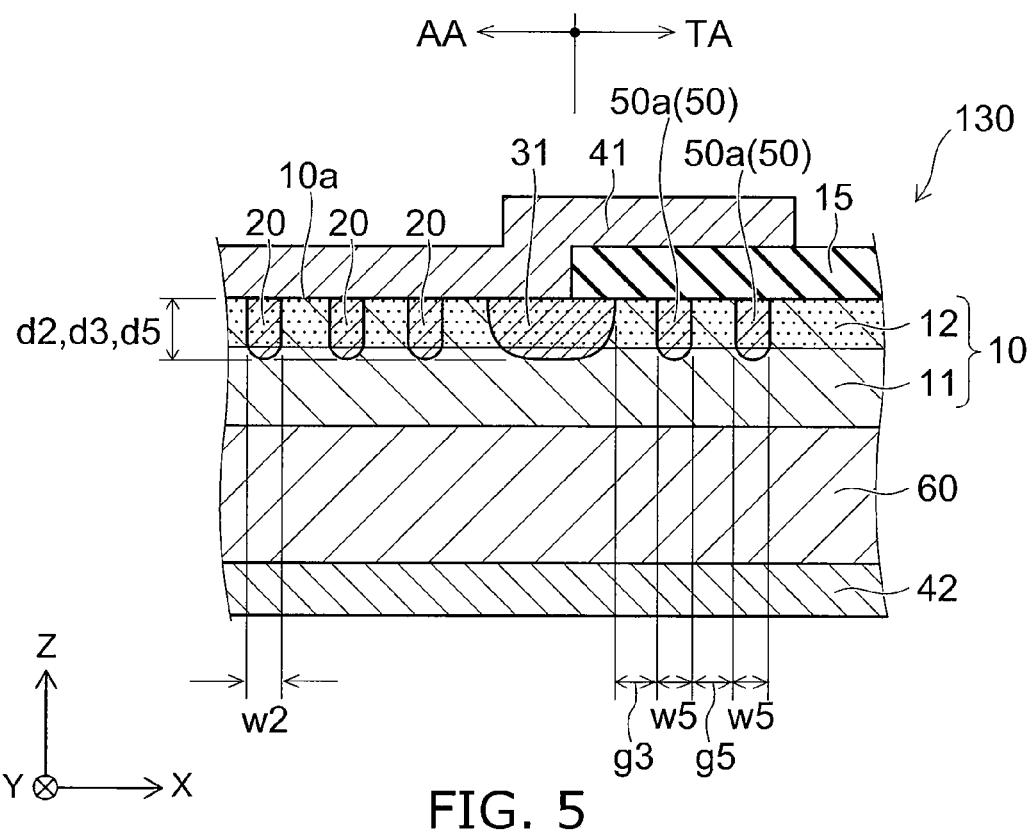
FIG. 5 is a schematic sectional view illustrating the configuration of a semiconductor device according to a third embodiment.

FIG. 5 is a schematic sectional view illustrating the configuration of a semiconductor device according to a third embodiment.

In a semiconductor device 130 according to a third embodiment, fifth semiconductor regions 50 are provided in the terminal region TA in addition to the configuration of the semiconductor device 120 according to the second embodiment. Hereinafter, this difference will be described mainly.

The fifth semiconductor region 50 is provided on the terminal region TA side from the third semiconductor region 31 on the first major surface 10a of the first semiconductor layer 10. The fifth semiconductor region 50 is provided so as to surround the third semiconductor region 31, and plays a role of guard ring with the third semiconductor region 31. The fifth semiconductor region 50 may be one and may be provided in a plurality as shown in FIG. 5. In FIG. 5, an example of two fifth semiconductor regions 50 provided is illustrated.

In the semiconductor device 130, a depth d5 of the semiconductor region 50 from the first major surface 10a along the Z-axis direction is generally the same as the depth d2 of the second semiconductor regions 20 from the first major surface 10a along the Z-axis direction. That is, the fifth semiconductor region 50 is formed in the same process as the second semiconductor regions 20. When the third semiconductor region 31 is formed in the same process as the second semiconductor regions 20, the fifth semiconductor region 50 is also formed in the same process as these regions.

In forming the second semiconductor regions 20 shown in FIG. 2C, an opening corresponding to the fifth semiconductor region 50 is separately formed with the openings 90a in the mask 90. p-type impurity ions such as B etc. are injected onto the first major surface 10a of the first semiconductor layer 10 and thermal diffusion is performed. Herewith, the fifth semiconductor region 50 is formed with formation of the plurality of second semiconductor regions 20. In this manner, the second semiconductor regions 20 and the third semiconductor region 31 are formed in the same process, thereby both are formed with the same depth.

In the semiconductor device 130 shown in FIG. 5, a width w5 of the fifth semiconductor region 50 along the X-axis direction is provided generally the same as the width w2 of the second semiconductor region 20 along the X-axis direction. A gap g3 between a fifth semiconductor region 50a nearest to the third semiconductor region 31 of the fifth semiconductor regions 50 and the third semiconductor region 31 along the X-axis direction is generally the same as a gap g5 between the fifth semiconductor region 50a and a fifth semiconductor region 50b adjacent to the fifth semiconductor region 50a along the X-axis direction. That is, the fifth semiconductor region 50 illustrated in FIG. 5 has the same configuration as the second semiconductor regions 20.

According to the semiconductor device 130 according to the third embodiment like this, it becomes possible to improve the breakdown voltage by the configuration such that a plurality of guard rings are provided by providing the third semiconductor region 31 and the fifth semiconductor regions 50 outside the third semiconductor region 31. If the fifth semiconductor regions 50 are formed in the same process as the second semiconductor regions 20, the fifth semiconductor regions 50 can be formed without separate additional process necessary for forming the fifth semiconductor regions 50.

When three or more fifth semiconductor regions 50 are provided, gap between the fifth semiconductor regions 50 may be constant and may be increased with being spaced from the third semiconductor region.

Fourth Embodiment

Figure 6:
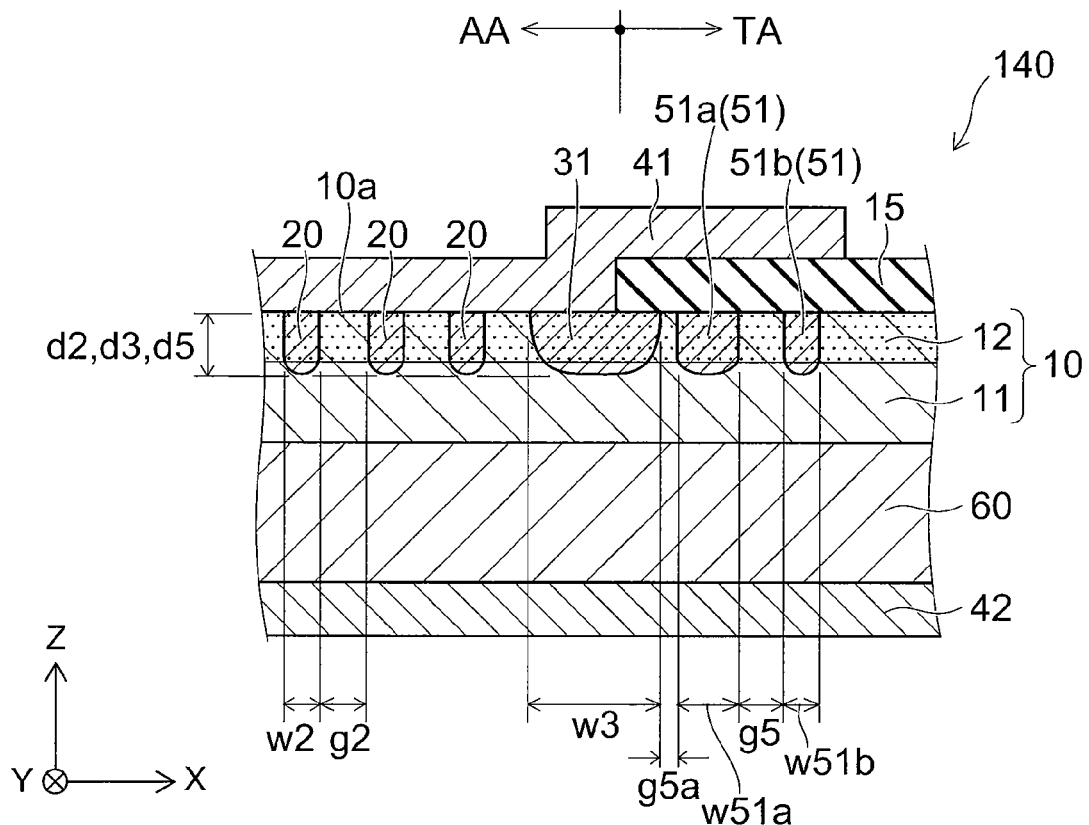
FIG. 6 is a schematic sectional view illustrating the configuration of a semiconductor device according to a fourth embodiment.

FIG. 6 is a schematic sectional view illustrating the configuration of a semiconductor device according to a fourth embodiment.

In a semiconductor device 140 according to the fourth embodiment, width and gap of the fifth semiconductor region are different in comparison with the semiconductor device 130 according to the third embodiment. Hereinafter, this difference will be described mainly.

In the semiconductor device 140 according to the fourth embodiment, fifth semiconductor regions 51 are provided in the order of the fifth semiconductor region 51a and the fifth semiconductor region 51b sequentially from the third semiconductor 31 side. A width w51a of the fifth semiconductor region 51a along the X-axis direction is wider than the width w2 of the second semiconductor regions 20 along the X-axis direction. The width w51a is narrower than the width w3 of the third semiconductor region 31 along the X-axis direction. A width w51b of the fifth semiconductor region 51b along the X-axis direction is narrower than the width w51a. That is, The widths w51a, w51b of the fifth semiconductor regions 51a, 51b become narrower with being spaced from the third semiconductor region 31. Herewith, the widths w3, w51a and w51b of the third semiconductor region 31, the fifth semiconductor region 51a and the fifth semiconductor region 51b functioning as guard rings become narrower with being spaced from the device region AA.

A second gap g5b being the shortest spacing between the fifth semiconductor region 51a and the fifth semiconductor region 51b along the first major surface 10a is wider than a first gap g5a being the shortest spacing between the third semiconductor region 31 and the fifth semiconductor region 51a along the first major surface. The first gap g5a is narrower than the second gap g5b between the second semiconductor regions 20. That is, the first gap g5a and the second gap g5b become wider with being spaced from the third semiconductor region 31. Herewith, the gaps between the third semiconductor region 31 and the fifth semiconductor region 51a and between the fifth semiconductor region 51a and the fifth semiconductor region 51b become wider with being spaced from the device region AA.

In order to form the fifth semiconductor regions 51a and 51b having widths and gaps like this, opening position and opening size in the mask used for forming the fifth semiconductor regions 50a and 50b of the semiconductor device 130 according to the third embodiment are sufficient to be changed.

In the semiconductor device 140, the electric field concentration at the corners of the third semiconductor region 31, the fifth semiconductor regions 51a and 51b functioning as guard rings can be gradually relaxed, thereby it becomes possible to improve the breakdown voltage of the semiconductor device 140.

In the semiconductor device 140 shown in FIG. 6, an example of two fifth semiconductor regions 51a and 51b provided outside the third semiconductor region 31 is shown, however three or more fifth semiconductor regions may be provided. Also in this case, similar to the above, the widths of the plurality of the fifth semiconductor regions 51 along the X-axis direction are sufficient to be configured to become narrower with being spaced from the device region AA, and the gaps between the plurality of the fifth semiconductor regions 51 along the X-axis direction are sufficient to be configured to become wider with being spaced from the device region AA.

Figure 7:
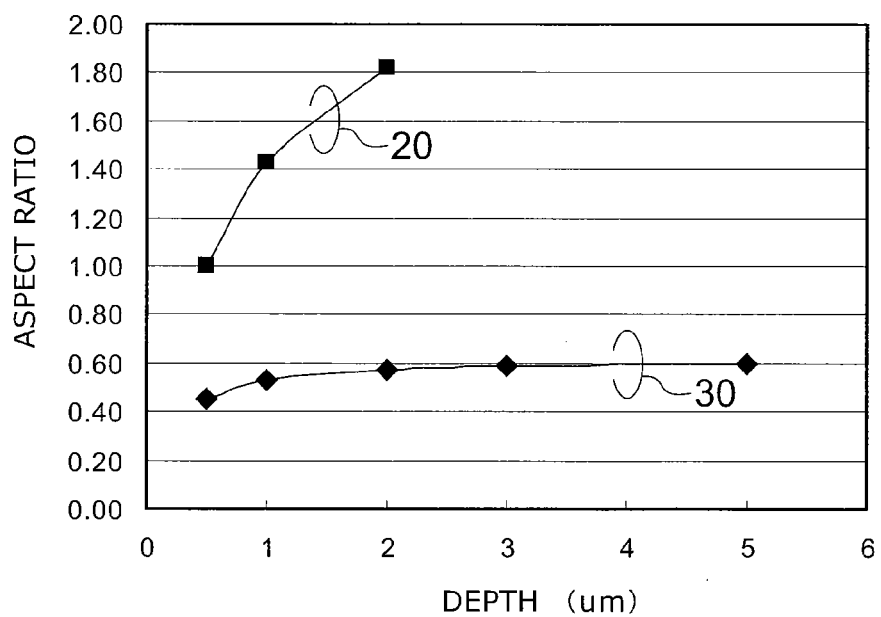
FIG. 7 is a view illustrating about an aspect ratio of a second and a third semiconductor region.

FIG. 7 is a view illustrating about an aspect ratio of a second and a third semiconductor region.

FIG. 7 illustrates the aspect ratios of the second and third semiconductor regions. Here, the aspect ratio of the second semiconductor region 20 is a ratio of the depth d2 of the second semiconductor regions 20 along the Z-axis direction to the width w2 along the X-axis direction, (d2/w2) in the semiconductor device 140 illustrated in FIG. 6. The aspect ratio of the third semiconductor region 31 is a ratio of the depth d3 of the third semiconductor region 31 along the Z-axis direction to the width w3 along the X-axis direction, (d3/w3) in the semiconductor device 140 illustrated in FIG. 6.

FIG. 7 shows the case of the first portion 11 with 0.3 Ω·cm, and a realistic value of the aspect ratio of the second semiconductor regions 20 is 1.00 or more and 1.82 or less. The aspect ratio of the third semiconductor region 31 is 0.45 or more and 0.60 or less. That is, in the embodiment, the aspect ration of the second semiconductor regions 20 is set 1.0 or more and the aspect ration of the third semiconductor region 31 is set smaller than the aspect ratio of the second semiconductor regions 20 in any depth.

Herewith, the semiconductor device 140 can be provided, in which the forward voltage can be low and the leak current can be small in the device region AA. The terminal breakdown voltage can be improved and the avalanche withstand capability can be higher by setting the aspect ratio of the third semiconductor region 31 smaller than the second semiconductor regions 20, namely, the width of the third semiconductor region 31 wider than the second semiconductor regions 20.

Figure 8:
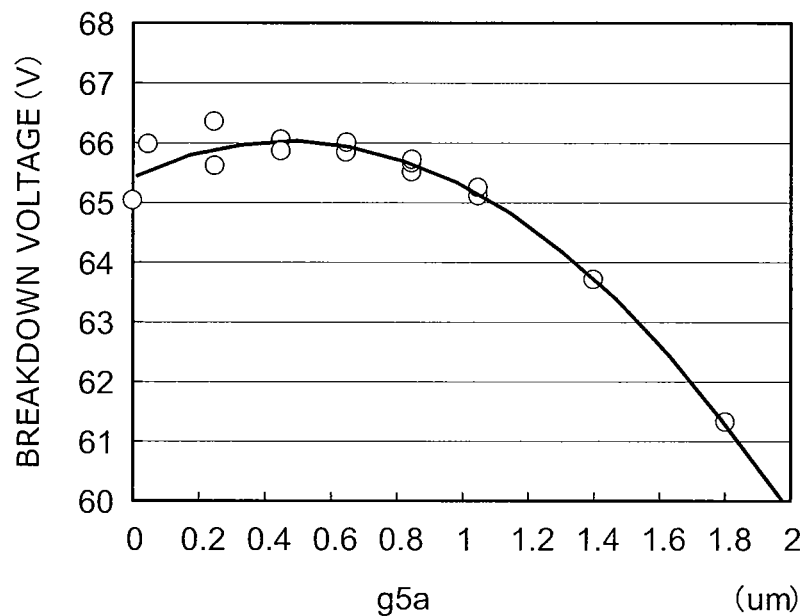
FIG. 8 is a view illustrating a relationship between a first gap and a breakdown voltage.

FIG. 8 is a view illustrating a relationship between a first gap and a breakdown voltage.

FIG. 8 shows simulation result calculating the breakdown voltage in the case where the second gap g5b is set constant (0.75 μm) and the first gap g5a is changed in the semiconductor device 140 illustrated in FIG. 6. The data of the first gap of 0 μm shows the calculation result without the fifth semiconductor region 51 provided.

It is determined that the breakdown voltage is improved by provided the fifth semiconductor region 51 compared with out providing the fifth semiconductor region 51. As an example, it is sufficient that the first gap g5a is 0.05 μm or more and 2.0 μm or less in the semiconductor device 140 with the breakdown voltage of 60 V. Furthermore, in order to improve the breakdown voltage with enough, it is notable that the first gap g5a is 0.05 μm and 0.9 μm or less.

Figure 9:
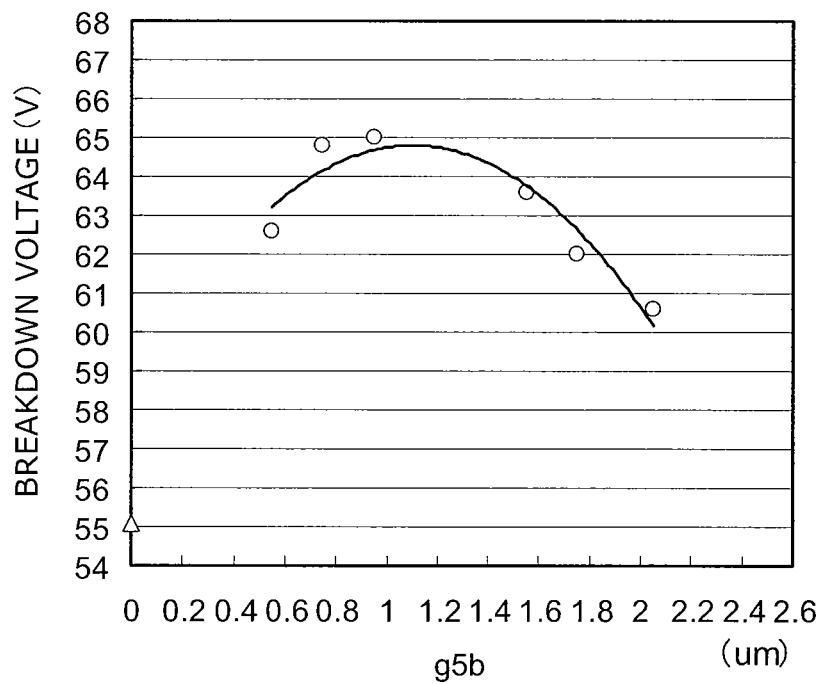
FIG. 9 and FIG. 10 are views illustrating relationships between a second gap and the breakdown voltage.
Figure 10:
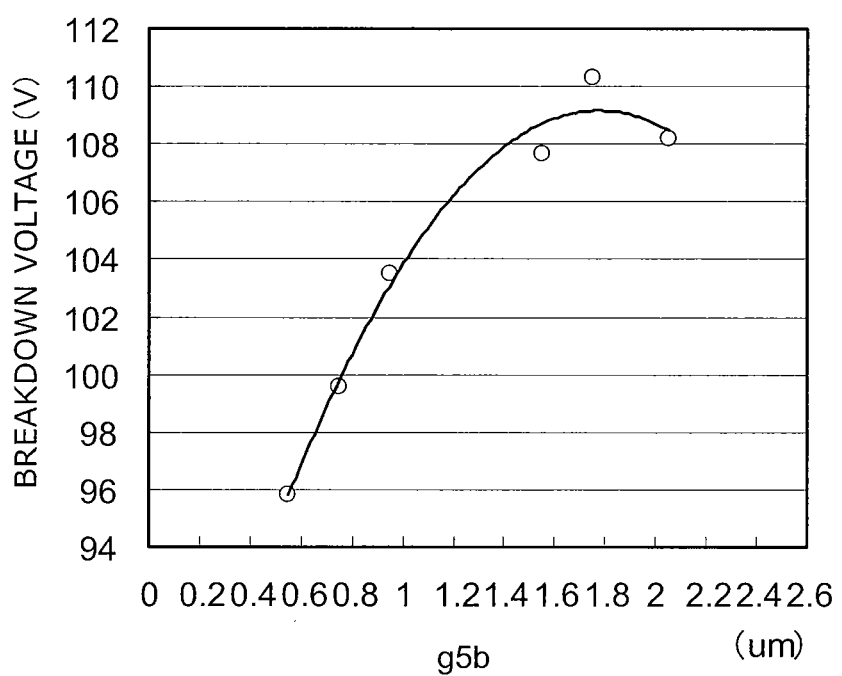

FIG. 9 and FIG. 10 are views illustrating relationships between a second gap and the breakdown voltage.

FIG. 9 illustrates the configuration of the breakdown voltage of approximately 60 volt (V) and FIG. 10 illustrates the configuration of the breakdown voltage of approximately 100 V.

The difference of the breakdown voltage level is due to the differences of the resistivity of the first semiconductor layer 10 and the thickness of the first semiconductor layer 10 along the Z-axis direction. Both figures show the measurement results of the breakdown voltage in the case where the first gap g5a in the semiconductor device 140 illustrated in FIG. 6 is constant (0.35 μm) and the second gap g5b is changed.

In FIG. 9, the data of the second gap g5b of 0 μm shows the calculation result without the fifth semiconductor region 51 provided. In the semiconductor device 140 having the breakdown voltage of approximately 60 V, providing the fifth semiconductor device 51 increases the breakdown voltage by approximately 10 V compared with out providing. It is notable that the second gap g5b is 0.5 μm or more and 1.8 μm or less in order to improve the breakdown voltage with enough.

As shown in FIG. 10, it is notable that the second gap g5b is 1.2 μm or more and 2.2 μm or less in order to improve the breakdown voltage with enough in the semiconductor device 140 with the breakdown voltage of approximately 100V.

As described above, according to the semiconductor device 110, 120, 130 and 140 according to the embodiments, reduction of the forward voltage and leak current can be achieved by configuring the diode of mixed Schottky barrier junction and pn junction.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the variations thereof described above are within the scope of the invention to the extent that the purport of the invention is included.

For example, in the embodiments or the variations described above, description is performed assuming the first conductivity type being an n-type and the second conductivity type being a p-type, however the invention is enable also assuming the first conductivity type being a p-type and the second conductivity type being an n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor layer of a first conductivity type;
a plurality of second semiconductor regions of a second conductivity type, the plurality of second semiconductor regions provided spaced from each other on a first major side of the first semiconductor layer;
a third semiconductor region of the second conductivity type, the third semiconductor region provided on the first major side so as to surround the plurality of second semiconductor regions;
a first electrode provided above the first semiconductor layer and the plurality of second semiconductor regions and
a fourth semiconductor layer having a resistivity lower than a resistivity of the first semiconductor layer, the fourth semiconductor layer contacting the plurality of second semiconductor regions and the third semiconductor region, and the fourth semiconductor layer provided on the first major side of the first semiconductor layer.

2. The device according to claim 1, wherein
the first electrode is provided from on the fourth semiconductor layer and the plurality of second semiconductor regions to on the third semiconductor region.

3. The device according to claim 1, wherein
a depth of the third semiconductor region from the first major side is deeper than a depth of the second semiconductor regions from the first major side.

4. The device according to claim 1, wherein
a depth of the third semiconductor region from the first major side is equal to a depth of the second semiconductor regions from the first major side.

5. The device according to claim 1, wherein
a depth of the fourth semiconductor layer from the first major side is shallower than a depth of the second semiconductor regions from the first major side.

6. The device according to claim 1, further comprising:
a plurality of fifth semiconductor regions of the second conductivity type provided so as to surround the third semiconductor region on the first major side.

7. The device according to claim 6, wherein
fifth semiconductor regions are provided spaced from each other on the first major side.

8. The device according to claim 7, wherein
a gap between fifth semiconductor regions that are adjacent along the first major side is equal to a gap between second semiconductor regions that are adjacent along the first major side.

9. The device according to claim 7, wherein
a first gap is shorter than a second gap, the first gap is a shortest gap along the first major side between the third semiconductor region and any of the fifth semiconductor regions, and the second gap is a shortest gap between fifth semiconductor regions along the first major side.

10. The device according to claim 9, wherein
the first gap is 0.05 micrometers or more and 2.0 micrometers or less.

11. The device according to claim 9, wherein
the second gap is 0.5 micrometers or more and 2.2 micrometers or less.

12. The device according to claim 1, wherein
the first electrode forms a Schottky junction with the first semiconductor layer and the second semiconductor regions.

13. The device according to claim 1, further comprising:
a second electrode; and
a sixth semiconductor region provided between the second electrode and a second major side of the first semiconductor layer, the second major side opposite the first major side, and the sixth semiconductor region having an impurity concentration higher than an impurity concentration in the first semiconductor layer.

14. The device according to claim 13, wherein
the second electrode is in ohmic contact with the sixth semiconductor region.

15. The device according to claim 1, wherein
a first aspect ratio is smaller than a second aspect ratio, the first aspect ratio being a ratio of a depth of the third semiconductor region from the first major side to a width of the third semiconductor region along the first major side, the second aspect ratio being a ratio of a depth of the second semiconductor regions from the first major side to a width of the second semiconductor regions along the first major side.

16. The device according to claim 15, wherein
the second aspect ratio is 1.00 or more and 1.82 or less.

17. The device according to claim 15, wherein
the first aspect ratio is 0.45 or more and 0.60 or less.

* * * * *